(12) United States Patent
Morimoto et al.

(10) Patent No.: US 11,500,028 B2
(45) Date of Patent: Nov. 15, 2022

(54) DETECTION DEVICE

(71) Applicant: Yazaki Corporation, Tokyo (JP)

(72) Inventors: Mitsuaki Morimoto, Shizuoka (JP);
Kazuo Sugimura, Shizuoka (JP);
Kazuya Tsubaki, Shizuoka (JP);
Eiichiro Oishi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 147 days.

(21) Appl. No.: 16/924,129

(22) Filed: Jul. 8, 2020

(65) Prior Publication Data

US 2021/0011088 A1 Jan. 14, 2021

(30) Foreign Application Priority Data

Jul. 12, 2019 (JP) ............... JP2019-129677

(51) Int. Cl.
*G01R 31/3842* (2019.01)
*B60L 3/00* (2019.01)
*B60L 3/04* (2006.01)
*G01R 19/00* (2006.01)

(52) U.S. Cl.
CPC ........ *G01R 31/3842* (2019.01); *B60L 3/0069* (2013.01); *B60L 3/04* (2013.01); *G01R 19/0084* (2013.01); *G01R 19/0092* (2013.01)

(58) Field of Classification Search
CPC ............ G01R 31/3842; G01R 19/0084; G01R 19/0092; G01R 31/52; G01R 31/006; G01R 31/385; G01R 19/00; B60L 3/0069; B60L 3/04; B60L 3/0046; B60L 58/10; B60L 2240/545; B60L 2240/547; B60L 2240/549; Y02T 10/70
See application file for complete search history.

(56) References Cited

U.S. PATENT DOCUMENTS

| | | | |
|---|---|---|---|
| 2016/0380589 A1* | 12/2016 | Morita | H02H 3/16 324/509 |
| 2017/0106764 A1* | 4/2017 | Beaston | H02J 3/322 |
| 2019/0013664 A1 | 1/2019 | Yasunori | |
| 2019/0237988 A1 | 8/2019 | Maekawa et al. | |

FOREIGN PATENT DOCUMENTS

| | | | | |
|---|---|---|---|---|
| JP | 2010054468 A | * | 3/2010 | ............ B60L 3/0046 |
| JP | 2010239773 A | * | 10/2010 | |
| JP | 2011-217544 A | | 10/2011 | |
| JP | 2014038023 A | * | 2/2014 | ........... G01R 31/025 |
| JP | 2016-6407 A | | 1/2016 | |
| JP | 2017-11825 A | | 1/2017 | |
| WO | 2017/208751 A1 | | 12/2017 | |
| WO | WO-2017208751 A | * | 12/2017 | ............. B60R 16/02 |

* cited by examiner

*Primary Examiner* — Natalie Huls
*Assistant Examiner* — Michael J Singletary
(74) *Attorney, Agent, or Firm* — Kenealy Vaidya LLP

(57) ABSTRACT

A sensor unit includes a current sensor that detects a current, a voltage sensor that detects a voltage, a ground fault sensor that detects a ground fault, and a common substrate on which the current sensor, the voltage sensor, and the ground fault sensor are mounted. In the sensor unit, for example, in a power supply circuit of a vehicle, the three sensors of the high voltage system can be integrated on the common substrate, so that an increase in the number of parts can be suppressed.

4 Claims, 6 Drawing Sheets

DETECTION DEVICE

CROSS-REFERENCE TO RELATED APPLICATION(S)

The present application claims priority to and incorporates by reference the entire contents of Japanese Patent Application No. 2019-129677 filed in Japan on Jul. 12, 2019.

BACKGROUND OF THE INVENTION

1. Field of the Invention

The present invention relates to a detection device.

2. Description of the Related Art

Conventionally, as a detection device, for example, Japanese Patent Application Laid-open No. 2011-217544 discloses a vehicle control system that controls an electrical connection between a storage battery mounted on a vehicle and an in-vehicle device according to a charging state of the storage battery.

Incidentally, in the vehicle control system described in JP 2011-217544 A, for example, in order to detect the charging state of the storage battery, a current detector, a voltage detector, a ground fault detector, etc. may be mounted on the vehicle. However, when these detectors are mounted on the vehicle, the number of parts may increase, and there is room for further improvement.

SUMMARY OF THE INVENTION

Therefore, the invention has been made in view of the above description, and an object of the invention is to provide a detection device that can appropriately detect a detection target in a power supply circuit of a vehicle.

A detection device according to one aspect of the present invention includes a current detector that detects a current; a voltage detector that detects a voltage; a ground fault detector that detects a ground fault; and a common substrate on which the current detector, the voltage detector, and the ground fault detector are mounted.

According to another aspect of the present invention, it is preferable that the detection device further includes a positive terminal connected to both the voltage detector and the ground fault detector and connected to a positive electrode side of a power supply circuit supplying electric power from a power supply of a vehicle to a load unit; and a negative terminal connected to both the voltage detector and the ground fault detector and connected to a negative electrode side of the power supply circuit.

According to still another aspect of the present invention, it is preferable that the detection device further includes a controller that commonly processes signals output from the current detector, the voltage detector, and the ground fault detector, respectively.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

A mode (embodiment) for carrying out the invention will be described in detail with reference to the drawings. The invention is not limited by content described in the following embodiment. In addition, components described below include those that can be easily assumed by those skilled in the art and those that are substantially the same. Further, configurations described below can be appropriately combined. In addition, various omissions, substitutions, or changes in the configuration can be made without departing from the spirit of the invention.

Embodiment

Figure 1:
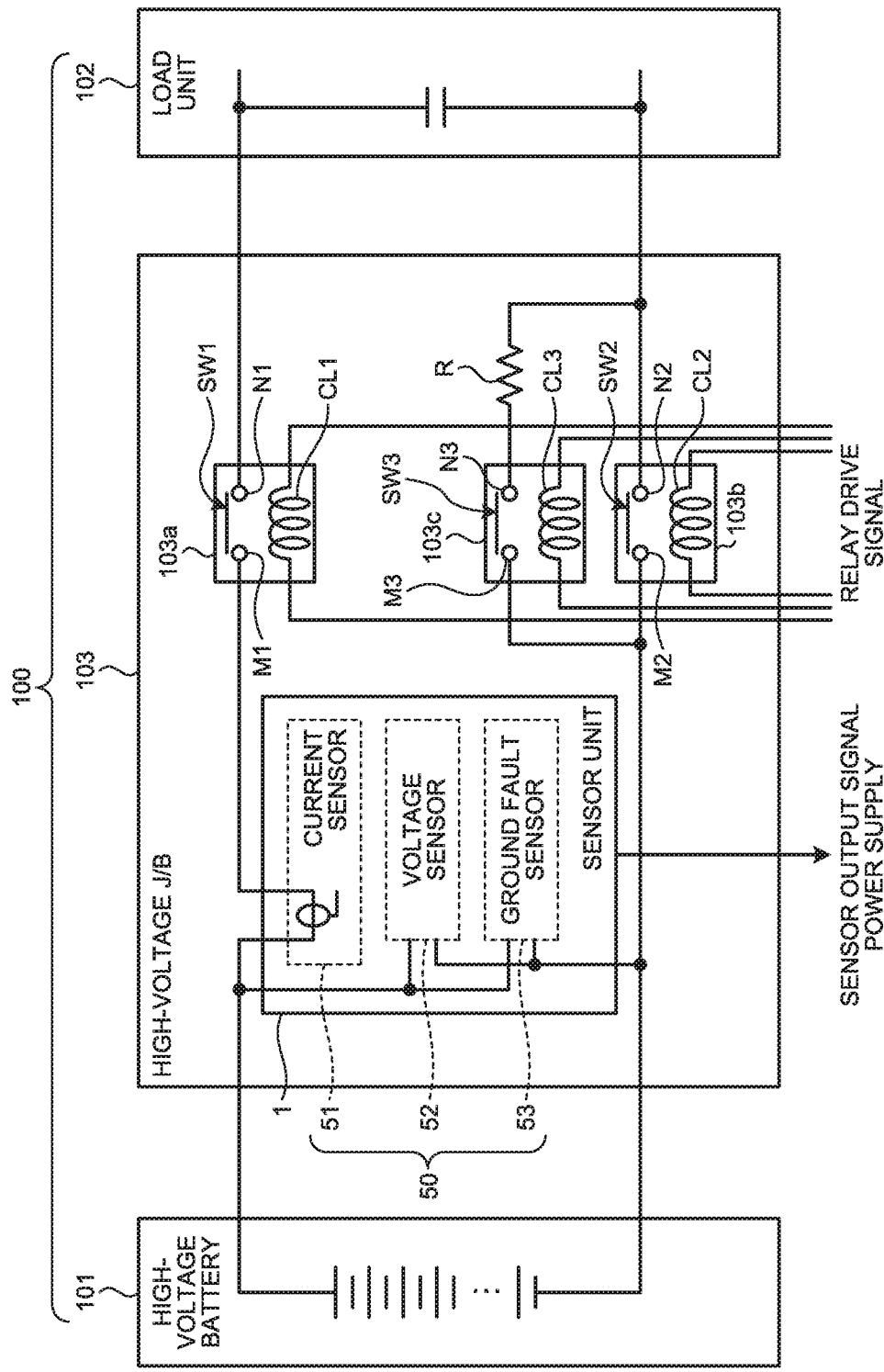
FIG. 1 is a block diagram illustrating a configuration example of a power supply circuit according to an embodiment.
Figure 2:
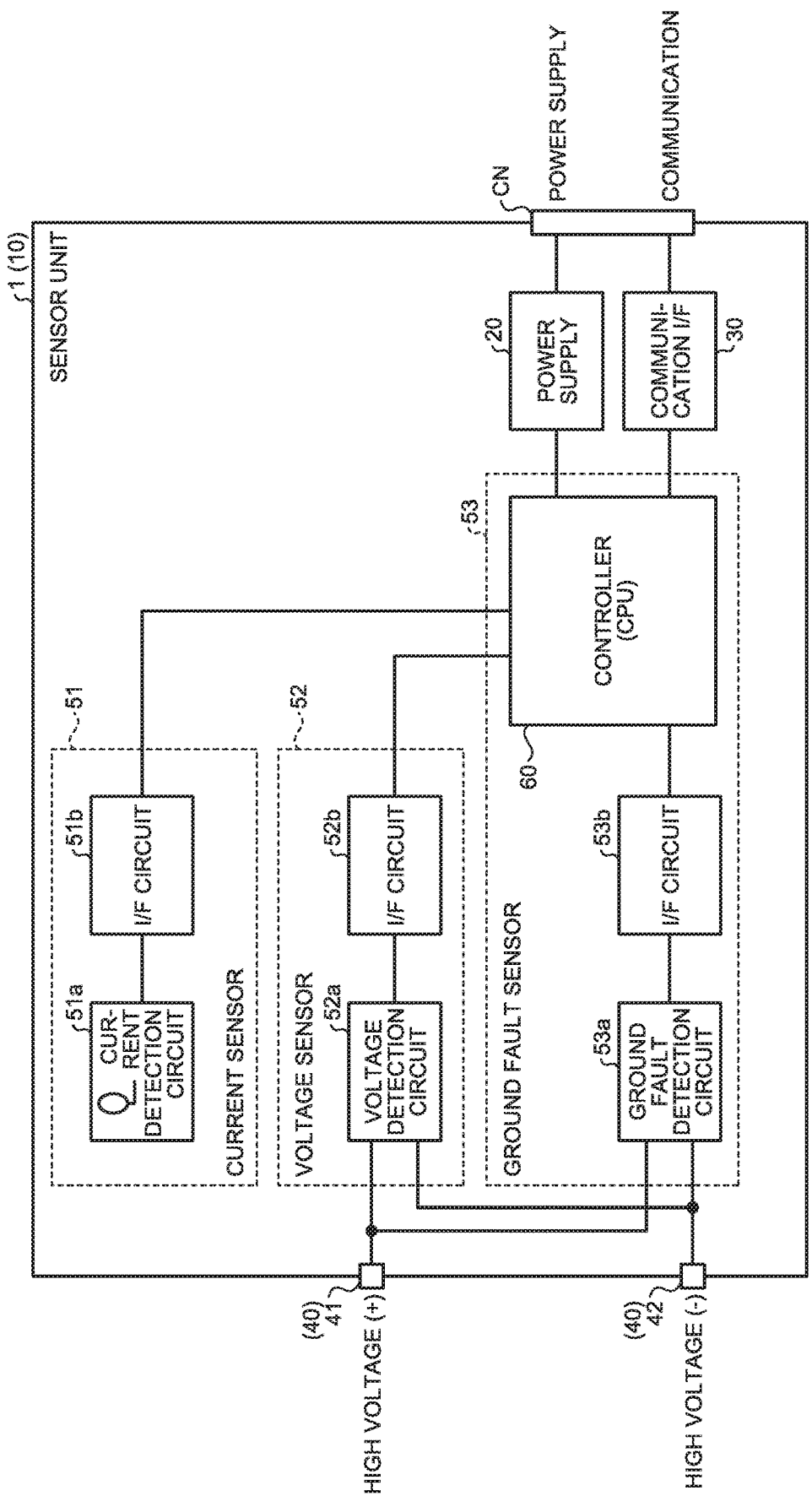
FIG. 2 is a block diagram illustrating a configuration example of a sensor unit according to the embodiment.
Figure 3:
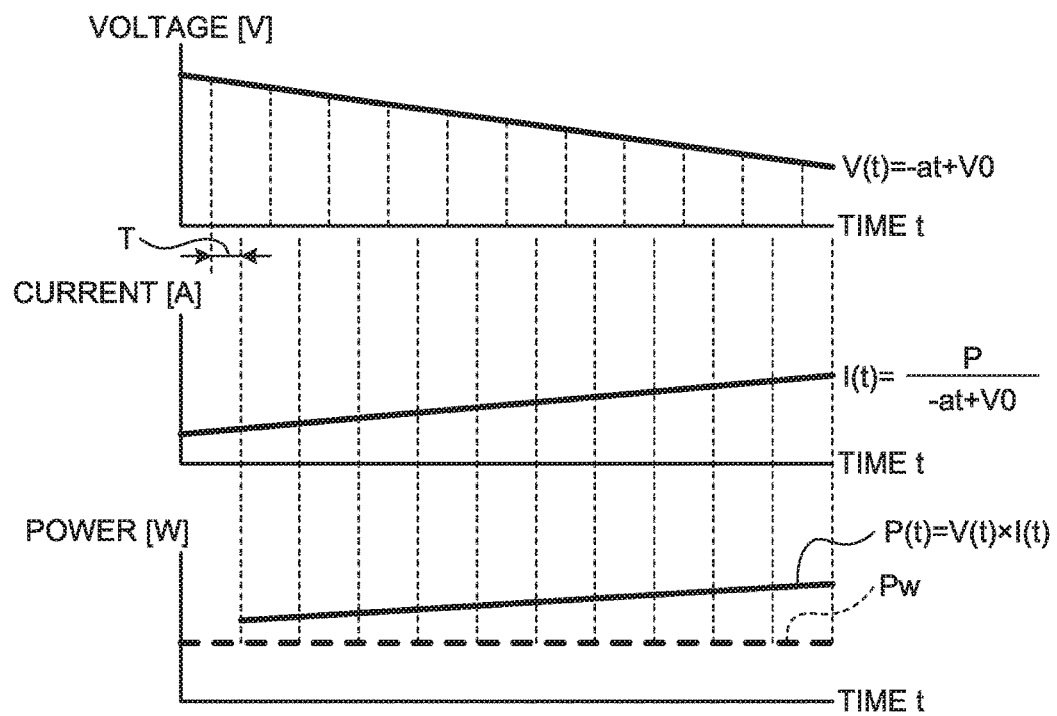
FIG. 3 is a diagram illustrating an example of power calculation according to a comparative example.
Figure 4:
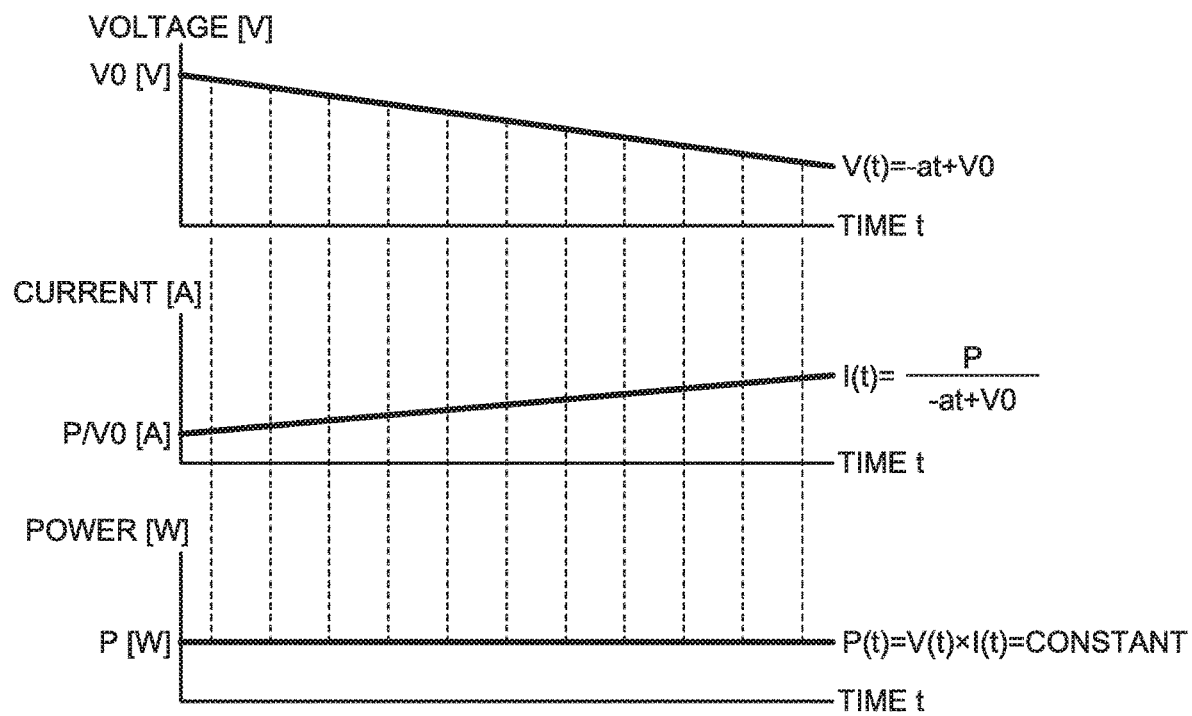
FIG. 4 is a diagram illustrating an example of power calculation according to the embodiment.
Figure 5:
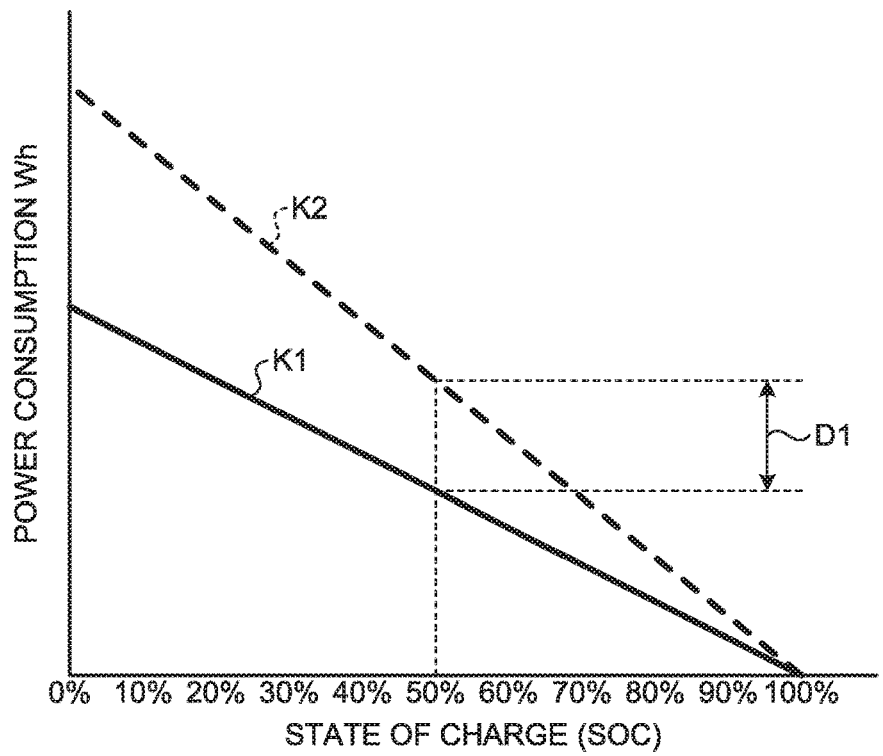
FIG. 5 is a diagram illustrating a first determination example of a deterioration state of a high-voltage battery according to the embodiment.
Figure 6:
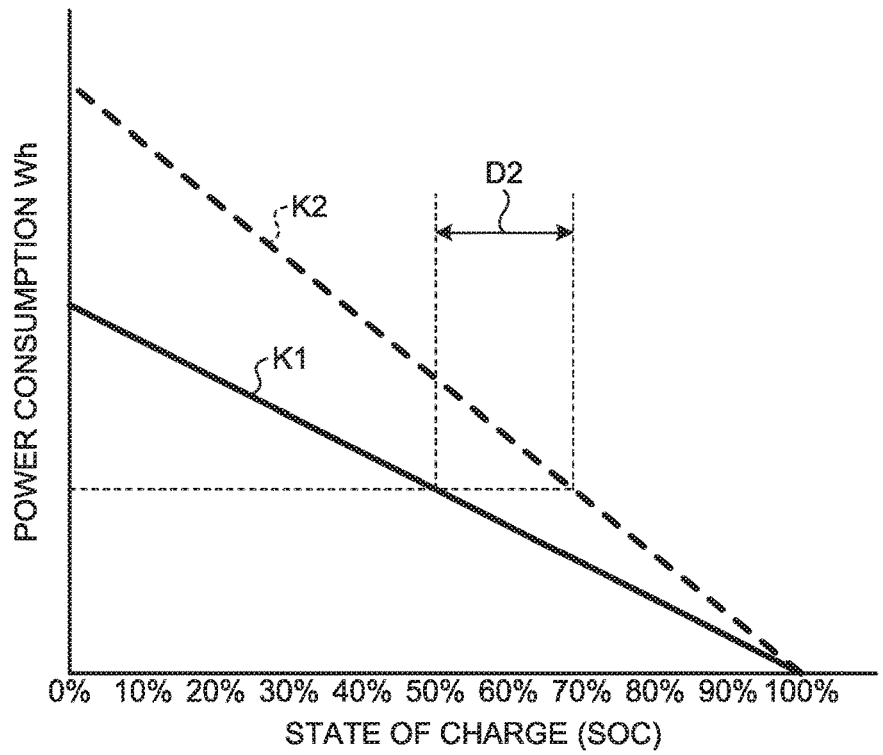
FIG. 6 is a diagram illustrating a second determination example of the deterioration state of the high-voltage battery according to the embodiment.

A sensor unit 1 of a power supply circuit 100 according to the embodiment will be described with reference to the drawings. FIG. 1 is a block diagram illustrating a configuration example of the power supply circuit 100 according to the embodiment. FIG. 2 is a block diagram illustrating a configuration example of the sensor unit 1 according to the embodiment. FIG. 3 is a diagram illustrating an example of power calculation according to a comparative example. FIG. 4 is a diagram illustrating an example of power calculation according to the embodiment. FIG. 5 is a diagram illustrating a first determination example of a deterioration state of a high-voltage battery 101 according to the embodiment. FIG. 6 is a diagram illustrating a second determination example of the deterioration state of the high-voltage battery 101 according to the embodiment.

The power supply circuit 100 supplies electric power from the high-voltage battery 101 to a load unit 102. For example, the power supply circuit 100 is mounted on a vehicle such as an electric vehicle (EV), a hybrid vehicle (HEV), and a plug-in hybrid vehicle (PHEV). As illustrated in FIG. 1, the power supply circuit 100 includes the high-voltage battery 101 as a power supply, the load unit 102, and a high-voltage junction box (J/B) 103.

The high-voltage battery 101 is a secondary battery capable of charging and discharging electric power. The high-voltage battery 101 is configured, for example, by connecting a plurality of battery cells in series. The high-voltage battery 101 is electrically insulated from a vehicle body of the vehicle. The high-voltage battery 101 is connected to the load unit 102 via the high-voltage J/B 103, and supplies high-voltage DC power to the load unit 102.

The load unit 102 consumes electric power, and includes, for example, a motor for driving an electric vehicle, etc., an inverter circuit, etc. The load unit 102 consumes electric power supplied from the high-voltage battery 101.

The high-voltage J/B 103 is an electric connection box for electrically connecting the high-voltage battery 101 and the load unit 102. The high-voltage J/B 103 is provided between the high-voltage battery 101 and the load unit 102. The high-voltage J/B 103 connects the high-voltage battery 101 and the load unit 102 by a bus bar, etc. press-molded into a plate shape using a metal plate such as a copper plate as a base material. The high-voltage J/B 103 includes an upstream-side relay 103a, downstream-side relays 103b and 103c, and the sensor unit 1 as a detection device.

The upstream-side relay 103a energizes or interrupts a current flowing through the bus bar. The upstream-side relay 103a is provided between a positive electrode of the high-voltage battery 101 and the load unit 102. The upstream-side relay 103a includes a switch SW1 and a coil CL1.

The switch SW1 has a first contact M1 and a second contact N1. The first contact M1 is connected to the positive electrode of the high-voltage battery 101, and the second contact N1 is connected to the load unit 102. The switch SW1 electrically connects (ON) the first contact M1 and the second contact N1 to electrically connect the positive electrode of the high-voltage battery 101 and the load unit 102. On the other hand, the switch SW1 electrically cuts off (OFF) the first contact M1 and the second contact N1 to electrically cut off the positive electrode of the high-voltage battery 101 and the load unit 102.

The coil CL1 turns ON or OFF the switch SW1. The coil CL1 is disposed to face the switch SW1, and turns ON or OFF the switch SW1 by a magnetic force. The coil CL1 is connected to an electronic control unit (ECU) (not illustrated). When a relay drive signal is output from the ECU, the coil CL1 turns ON the switch SW1 by a magnetic force. On the other hand, in the coil CL1, when no relay drive signal is output from the ECU, no magnetic force acts, and the switch SW1 is turned OFF.

The downstream-side relay 103b energizes or interrupts a current flowing through the bus bar. The downstream-side relay 103b is provided between a negative electrode of the high-voltage battery 101 and the load unit 102. The downstream-side relay 103b includes a switch SW2 and a coil CL2.

The switch SW2 has a first contact M2 and a second contact N2. The first contact M2 is connected to the negative electrode of the high-voltage battery 101, and the second contact N2 is connected to the load unit 102. The switch SW2 electrically connects (ON) the first contact M2 and the second contact N2 to electrically connect the negative electrode of the high-voltage battery 101 and the load unit 102. On the other hand, the switch SW2 electrically cuts off (OFF) the first contact M2 and the second contact N2 to electrically cut off the negative electrode of the high-voltage battery 101 and the load unit 102.

The coil CL2 turns ON or OFF the switch SW2. The coil CL2 is disposed to face the switch SW2, and turns ON or OFF the switch SW2 by a magnetic force. The coil CL2 is connected to the ECU. When a relay drive signal is output from the ECU, the coil CL2 turns ON the switch SW2 by a magnetic force. On the other hand, in the coil CL2, when no relay drive signal is output from the ECU, no magnetic force acts, and the switch SW2 is turned OFF.

The downstream-side relay 103c energizes or interrupts a current flowing through the bus bar. The downstream-side relay 103c is provided between the negative electrode of the high-voltage battery 101 and the load unit 102, and is connected in parallel to the downstream-side relay 103b via a resistor R. The downstream-side relay 103c includes a switch SW3 and a coil CL3.

The switch SW3 has a first contact M3 and a second contact N3. The first contact M3 is connected to the negative electrode of the high-voltage battery 101, and the second contact N3 is connected to the load unit 102 via the resistor R. The switch SW3 electrically connects (ON) the first contact M3 and the second contact N3 to electrically connect the negative electrode of the high-voltage battery 101 and the load unit 102. On the other hand, the switch SW3 electrically cuts off (OFF) the first contact M3 and the second contact N3 to electrically cut off the negative electrode of the high-voltage battery 101 and the load unit 102.

The coil CL3 turns ON or OFF the switch SW3. The coil CL3 is disposed to face the switch SW3, and turns ON or OFF the switch SW3 by a magnetic force. The coil CL3 is connected to the ECU. When a relay drive signal is output from the ECU, the coil CL3 turns ON the switch SW3 by a magnetic force. On the other hand, in the coil CL3, when no relay drive signal is output from the ECU, no magnetic force acts, and the switch SW3 is turned OFF.

In the case of supplying electric power from the high-voltage battery 101 to the load unit 102, the ECU turns ON the upstream-side relay 103a. Subsequently, the ECU turns ON the downstream-side relay 103c to prevent a rush current to the load unit 102, and turns ON the downstream-side relay 103b after a capacitor of the load unit 102 is charged. The ECU turns OFF the downstream-side relay 103c when the upstream-side relay 103a and the downstream-side relay 103b are turned ON and the electric power supply to the load unit 102 is started. In the case of not supplying electric power from the high-voltage battery 101 to the load unit 102, the ECU turns OFF the upstream-side relay 103a and the downstream-side relays 103b and 103c.

The sensor unit 1 detects a detection target in the power supply circuit 100. In the present embodiment, the sensor unit 1 is provided in the high-voltage J/B 103, and is connected to the bus bar of the high-voltage J/B 103. In this way, the sensor unit 1 relatively easily acquires a high-voltage signal for a sensor. In addition, since the sensor unit 1 is provided in the high-voltage J/B 103 having the upstream-side relay 103a and the downstream-side relays 103b and 103c, a wire harness only needs to be connected to the high-voltage J/B 103. Therefore, since the wire harness and the sensor unit 1 are not directly connected, an insulation treatment on the wire harness can be omitted. As illustrated in FIG. 1 and FIG. 2, the sensor unit 1 includes a substrate 10, a power supply 20, a communication I/F 30, a terminal portion 40, a sensor part 50, and a controller 60.

The substrate 10 is a substrate on which various electronic components are mounted and which is included in an electronic circuit for electrically connecting the electronic components and is a so-called printed circuit board. Referring to the substrate 10, for example, a wiring pattern (print pattern) is formed (printed) by a conductive member such as copper foil on an insulating layer made of an insulating material such as epoxy resin, glass epoxy resin, paper epoxy resin, or ceramic. A current sensor 51 as a current detector, a voltage sensor 52 as a voltage detector, and a ground fault sensor 53 as a ground fault detector are mounted on the substrate 10. That is, the current sensor 51, the voltage sensor 52, and the ground fault sensor 53 are collectively mounted on one substrate 10. In the present embodiment, in the power supply circuit 100, the current sensor 51 is disposed on the positive electrode side, the ground fault sensor 53 is disposed on the negative electrode side, and the voltage sensor 52 is disposed between the current sensor 51 and the ground fault sensor 53.

The power supply 20 supplies electric power to the controller 60. The power supply 20 is connected to an external power supply (not illustrated) via a connector CN, converts electric power supplied from the external power supply into predetermined electric power, and supplies the converted electric power to the controller 60.

The communication I/F 30 is an interface for communicating with an external communication device. The communication I/F 30 is connected to the ECU via the connector CN, and is connected to the controller 60. For example, the communication I/F 30 converts a sensor output signal output from the controller 60 into a signal format that can be input to the ECU and outputs the signal to the ECU.

The terminal portion 40 is electrically connected to the positive electrode side and the negative electrode side of the power supply circuit 100. The terminal portion 40 has a positive terminal 41 and a negative terminal 42. The positive terminal 41 is mounted on the substrate 10, and both the voltage sensor 52 and the ground fault sensor 53 are connected thereto. In the positive terminal 41, for example, a conducting wire extending from the positive terminal 41 onto the substrate 10 branches in the middle into two parts, one of the parts is connected to the voltage sensor 52, and the other part is connected to the ground fault sensor 53. Further, the positive terminal 41 is connected to the positive electrode side of the power supply circuit 100. The positive terminal 41 is connected, for example, between the positive electrode of the high-voltage battery 101 and the upstream-side relay 103a.

The negative terminal 42 is mounted on the substrate 10, and both the voltage sensor 52 and the ground fault sensor 53 are connected thereto. In the negative terminal 42, for example, a conducting wire extending from the negative terminal 42 onto the substrate 10 branches in the middle into two parts, one of the parts is connected to the voltage sensor 52, and the other part is connected to the ground fault sensor 53. Further, the negative terminal 42 is connected to the negative electrode side of the power supply circuit 100. The negative terminal 42 is connected, for example, between the negative electrode of the high-voltage battery 101 and the downstream-side relays 103b and 103c.

The sensor part 50 detects a detection target in the power supply circuit 100 of the vehicle. The sensor part 50 is mounted on the substrate 10. The sensor part 50 includes the current sensor 51, the voltage sensor 52, and the ground fault sensor 53.

The current sensor 51 is a sensor that detects a current. The current sensor 51 is mounted on the substrate 10. The current sensor 51 includes a current detection circuit 51a and an I/F circuit 51b. The current detection circuit 51a has a current detection element, and this current detection element is provided between the positive electrode of the high-voltage battery 101 and the upstream-side relay 103a. The current detection circuit 51a detects a current flowing from the high-voltage battery 101 to the load unit 102 using the current detection element. The current detection circuit 51a is connected to the I/F circuit 51b, and outputs a current value of the detected current to the I/F circuit 51b.

The I/F circuit 51b converts the current value into a predetermined data format. The I/F circuit 51b is connected to the current detection circuit 51a and the controller 60, converts the current value output from the current detection circuit 51a into a data format that can be input to the controller 60, and outputs the converted current value to the controller 60.

The voltage sensor 52 is a sensor that detects a voltage. The voltage sensor 52 is mounted on the substrate 10. The voltage sensor 52 includes a voltage detection circuit 52a and an I/F circuit 52b. The voltage detection circuit 52a is connected to the positive terminal 41 and the negative terminal 42. Further, the voltage detection circuit 52a is connected to the positive electrode side of the power supply circuit 100 via the positive terminal 41, and connected to the negative electrode side of the power supply circuit 100 via the negative terminal 42. The voltage detection circuit 52a detects a voltage indicating a potential difference between the positive electrode side and the negative electrode side of the power supply circuit 100. The voltage detection circuit 52a is connected to the I/F circuit 52b, and outputs a voltage value of the detected voltage to the I/F circuit 52b.

The I/F circuit 52b converts the voltage value into a predetermined data format. The I/F circuit 52b is connected to the voltage detection circuit 52a and the controller 60, converts the voltage value output from the voltage detection circuit 52a into a data format that can be input to the controller 60, and outputs the converted voltage value to the controller 60.

The ground fault sensor 53 is a sensor that detects a ground fault. The ground fault sensor 53 is mounted on the substrate 10. The ground fault sensor 53 includes a ground fault detection circuit 53a and an I/F circuit 53b. The ground fault detection circuit 53a is connected to the positive terminal 41 and the negative terminal 42. Further, ground fault detection circuit 53a is connected to the positive electrode side of the power supply circuit 100 via the positive terminal 41, and connected to the negative electrode side of the power supply circuit 100 via the negative terminal 42. The ground fault detection circuit 53a detects a voltage used for determining a ground fault. The ground fault detection circuit 53a is connected to the I/F circuit 52b, and outputs a voltage value of the detected voltage to the I/F circuit 52b.

The I/F circuit 53b converts the voltage value into a predetermined data format. The I/F circuit 53b is connected to the ground fault detection circuit 53a and the controller 60, converts the voltage value output from the ground fault detection circuit 53a into a data format that can be input to the controller 60, and outputs the converted voltage value to the controller 60.

The controller 60 performs various calculations based on a detection result detected by the sensor part 50. The controller 60 is configured to include an electronic circuit mainly including a known microcomputer that includes a CPU, a ROM and a RAM included in a storage unit, and an interface. In the present embodiment, the controller 60 is mounted on the substrate 10 and functions as a CPU that determines a ground fault in the ground fault sensor 53. However, the controller 60 additionally functions as a CPU that processes a current value and a voltage value.

The controller 60 processes signals output from the current sensor 51, the voltage sensor 52, and the ground fault sensor 53 in common. For example, the controller 60 is connected to the I/F circuit 53b of the ground fault sensor 53, and a voltage value is output from the I/F circuit 53b. The controller 60 determines a ground fault based on the voltage value output from the I/F circuit 53b of the ground fault sensor 53.

In addition, the controller 60 is connected to the I/F circuit 51b of the current sensor 51, and a current value is output from the I/F circuit 51b. Further, the controller 60 is connected to the I/F circuit 52b of the voltage sensor 52, and a voltage value is output from the I/F circuit 52b. The controller 60 calculates a power value based on the current value output from the I/F circuit 51b and the voltage value output from the I/F circuit 52b. In this case, the controller 60 calculates a power value based on the current value and the voltage value acquired at a predetermined sampling cycle. That is, the power value is calculated based on the current value and the voltage value acquired by one (common) controller 60 at the common sampling cycle.

Here, in a current sensor according to a comparative example, a controller of the current sensor acquires a current value at a predetermined sampling cycle. In addition, in a voltage sensor according to the comparative example, a controller of the voltage sensor different from the controller of the current sensor acquires a voltage value at a predetermined sampling cycle. Accordingly, in the comparative example, the current value and the voltage value are acquired by different controllers, respectively. Thus, as illustrated in FIG. 3, in the case of calculating a power value P(t), a timing of acquiring the current value I(t) and the voltage value V(t) is shifted by a time T, which causes a problem that an error occurs between the power value P(t) obtained by the calculation and an actual power value Pw. Note that, in FIG. 3, "V0" denotes an initial voltage, "a" denotes a constant of voltage drop, "P" denotes rated power, and "t" denotes time.

On the other hand, in the sensor unit 1 according to the embodiment, one (common) controller 60 calculates a power value based on a current value and a voltage value (each signal) acquired at a common sampling cycle. In this way, as illustrated in FIG. 4, in the case of calculating the power value P(t), the controller 60 can accurately calculate instantaneous power (power value P(t)) when the timing of acquiring the current value I(t) and the voltage value V(t) is synchronized, and the current value I(t) and the voltage value V(t) are multiplied. In this way, the controller 60 can make the calculated power value P(t) equal to the actual power value Pw. Then, the controller 60 can calculate the amount of power used by the high-voltage battery 101 or the amount of power with which the high-voltage battery 101 is charged by integrating the instantaneous power with time. Note that, in FIG. 4, "V0" denotes an initial voltage, "a" denotes a constant of voltage drop, "P" denotes rated power, and "t" denotes time.

The ECU can determine a deterioration state of the high-voltage battery 101 by comparing the amount of power calculated by the controller 60 with the state of charge (SOC) of the high-voltage battery 101 monitored by a battery monitoring unit (not illustrated). For example, as illustrated in FIG. 5, in a case where the SOC of the high-voltage battery 101 is 50%, when power consumption in a use state K1 of the high-voltage battery 101 is smaller than power consumption in an initial state K2 of the high-voltage battery 101 (when a difference D1 occurs), the ECU can determine that the high-voltage battery 101 deteriorates. Note that, in FIG. 5, a vertical axis represents the power consumption (Wh), and a horizontal axis represents the state of charge (SOC).

In addition, for example, as illustrated in FIG. 6, in a case where the power consumption of the high-voltage battery 101 is a predetermined value, when the SOC in the use state K1 of the high-voltage battery 101 is smaller than the SOC in the initial state K2 of the high-voltage battery 101 (when a difference D2 occurs), the ECU can determine that the high-voltage battery 101 deteriorates. Note that, in FIG. 6, a vertical axis represents the power consumption (Wh), and a horizontal axis represents the state of charge (SOC). As described above, the ECU can determine the deterioration state of the high-voltage battery 101 by comparing the amount of power calculated by the sensor unit 1 with the SOC acquired by the battery monitoring unit. By this configuration, conventionally, the deterioration state of the high-voltage battery 101 has been diagnosed by the battery monitoring unit. However, in the present embodiment, a redundant configuration for the deterioration diagnosis of the high-voltage battery 101 can be easily configured.

As described above, the sensor unit 1 according to the embodiment includes the current sensor 51 that detects a current, the voltage sensor 52 that detects a voltage, the ground fault sensor 53 that detects a ground fault, and the common substrate 10 on which the current sensor 51, the voltage sensor 52, and the ground fault sensor 53 are mounted. Conventionally, each sensor has an individual substrate 10, which increases the number of parts. On the other hand, in the sensor unit 1 according to the embodiment, in the power supply circuit 100 of the vehicle, the three sensors of the high voltage system can be integrated on the common substrate 10, so that an increase in the number of parts can be suppressed. As a result, the sensor unit 1 can properly detect a detection target in the power supply circuit 100.

The sensor unit 1 further includes the positive terminal 41 and the negative terminal 42. The positive terminal 41 is connected to both the voltage sensor 52 and the ground fault sensor 53, and is connected to the positive electrode side of the electric power supply circuit 100 that supplies power from the high-voltage battery 101 of the vehicle to the load unit 102. The negative terminal 42 is connected to both the voltage sensor 52 and the ground fault sensor 53 and is connected to the negative electrode side of the power supply circuit 100. By this configuration, the sensor unit 1 can take out a high-voltage portion of the power supply circuit 100 via the common positive terminal 41 and negative terminal 42, and can minimize branching from the high-voltage portion. As a result, the sensor unit 1 can reduce the high-voltage wire harness, and can improve wiring properties of the high-voltage wire harness.

The sensor unit 1 includes the controller 60 that commonly processes signals output from the current sensor 51, the voltage sensor 52, and the ground fault sensor 53, respectively. By this configuration, in the sensor unit 1, the one (common) controller 60 can calculate a power value based on a current value and a voltage value acquired at a common sampling cycle, and can accurately calculate the power value.

Modifications

Figure 7:
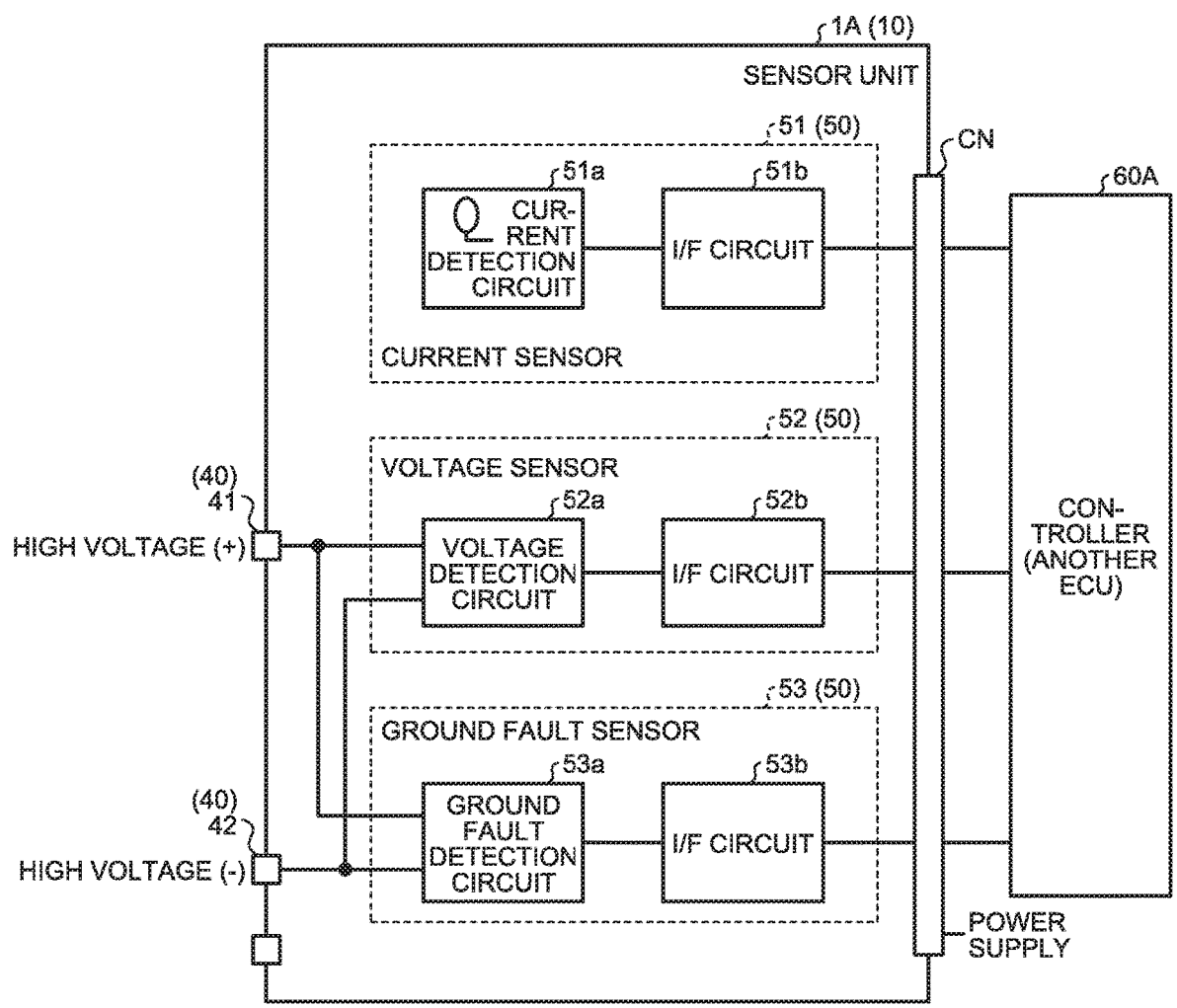
FIG. 7 is a block diagram illustrating a configuration example of a sensor unit according to a first modification of the embodiment.

Next, a modification of the embodiment will be described. In the modification, the same components as those of the embodiment are denoted by the same reference numerals, and detailed description thereof will be omitted. FIG. 7 is a block diagram illustrating a configuration example of a sensor unit 1A according to a first modification of the embodiment. The sensor unit 1A according to the first modification is different from the sensor unit 1 according to the embodiment in that a controller 60A is not included in the sensor unit 1A. As illustrated in FIG. 7, the sensor unit 1A includes a substrate 10, a terminal portion 40, and a sensor part 50. The sensor unit 1A is connected to an external controller 60A (another ECU) via a connector CN. The controller 60A performs various calculations based on a detection result detected by the sensor part 50. As described above, the sensor unit 1A may be disposed outside the controller 60A without being included in the sensor unit 1A.

Figure 8:
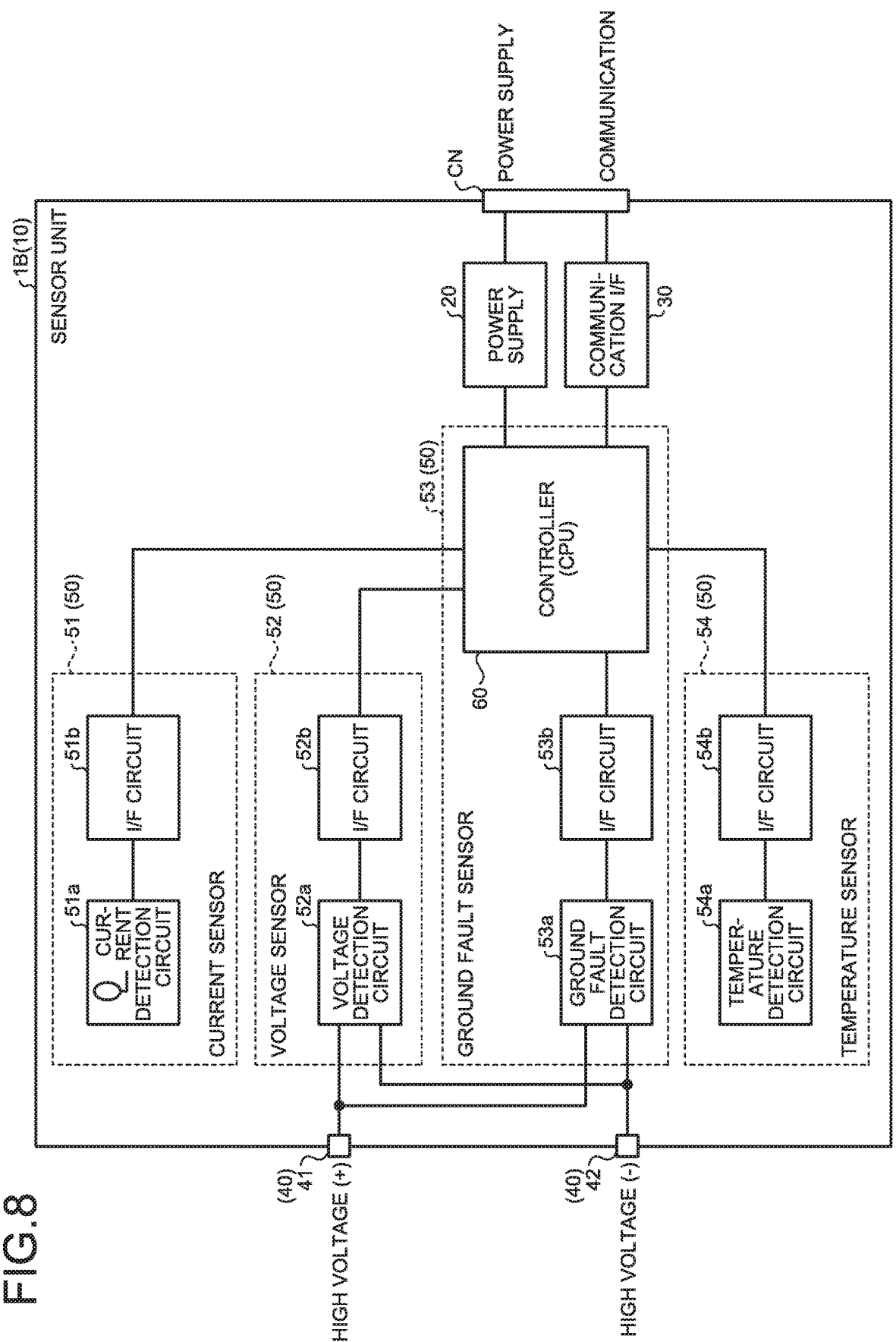
FIG. 8 is a block diagram illustrating a configuration example of a sensor unit according to a second modification of the embodiment.

FIG. 8 is a block diagram illustrating a configuration example of a sensor unit 1B according to a second modification of the embodiment. The sensor unit 1B according to the second modification is different from the sensor unit 1 of the embodiment and the sensor unit 1A of the first modification in further including a temperature sensor 54. As illustrated in FIG. 8, the sensor unit 1B includes a substrate 10, a power supply 20, a communication I/F 30, a terminal portion 40, a sensor part 50, and a controller 60. The sensor part 50 includes a current sensor 51, a voltage sensor 52, the ground fault sensor 53, and the temperature sensor 54.

The temperature sensor 54 is a sensor that detects a temperature. The temperature sensor 54 is mounted on the substrate 10, and includes a temperature detection circuit 54a and an I/F circuit 54b. The temperature detection circuit 54a detects the temperature of the sensor unit 1. The temperature detection circuit 54a is connected to the I/F circuit 54b and outputs the detected temperature to the I/F circuit 54b.

The I/F circuit 54b converts the detected temperature into a predetermined data format. The I/F circuit 54b is connected to the temperature detection circuit 54a and the controller 60, converts the detected temperature output from the temperature detection circuit 54a into a data format that can be input to the controller 60, and outputs the converted detected temperature to the controller 60. As described above, the sensor unit 1B further includes the temperature sensor 54. Note that, the sensor unit 1B may include other sensors in addition to the four sensors described above.

A description has been given of an example in which each of the sensor units 1, 1A, and 1B has the common positive terminal 41 and negative terminal 42. However, the invention is not limited thereto, and each of the voltage sensor 52 and the ground fault sensor 53 may be configured to have the positive terminal 41 and the negative terminal 42, respectively.

In addition, a description has been given of an example of including the controller 60 that commonly processes the signals output from the current sensor 51, the voltage sensor 52, and the ground fault sensor 53. However, the invention is not limited thereto, and it is possible to include a plurality of controllers that individually processes the signals output from the sensors, respectively.

In addition, a description has been given of an example in which the sensor unit 1 is provided inside the high-voltage J/B 103. However, the invention is not limited thereto, and the sensor unit 1 may not be provided inside the high-voltage J/B 103.

The detection device according to the present embodiment can integrate the respective detectors on a common substrate, and thus can suppress an increase in the number of parts. As a result, it is possible to appropriately detect the detection target in the power supply circuit.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A detection device comprising:
   a current detector that detects a current;
   a voltage detector that detects a voltage;
   a ground fault detector that detects a ground fault;
   a common substrate on which the current detector, the voltage detector, and the ground fault detector are mounted;
   a positive terminal, the positive terminal is connected to both the voltage detector and the ground fault detector and connected to a positive electrode side of a power supply circuit supplying electric power from a power supply of a vehicle to a load unit; and
   a negative terminal, the negative terminal is connected to both the voltage detector and the ground fault detector and connected to a negative electrode side of the power supply circuit.

2. The detection device according to claim 1, further comprising:
   a controller that commonly processes signals output from the current detector, the voltage detector, and the ground fault detector, respectively.

3. The detection device according to claim 1, wherein the positive terminal and the negative terminal are each mounted on the substrate.

4. The detection device according to claim 1, wherein
   the positive terminal and the negative terminal are each mounted on the substrate, and
   the positive terminal and the negative terminal are spaced away from the voltage detector and the ground fault detector.

* * * * *